United States Patent [19]

Kudo

[11] Patent Number: 4,865,658

[45] Date of Patent: Sep. 12, 1989

[54] OXYGEN-CONTAINING FERROMAGNETIC AMORPHOUS ALLOY AND METHOD OF PREPARING THE SAME

[75] Inventor: Toshio Kudo, Tokyo, Japan

[73] Assignees: Research Development Corporation of Japan; Casio Computer Co., Ltd., both of Tokyo, Japan

[21] Appl. No.: 204,192

[22] Filed: Jun. 8, 1988

Related U.S. Application Data

[60] Division of Ser. No. 11,646, Feb. 4, 1987, which is a continuation-in-part of Ser. No. 747,132, Jun. 20, 1985, abandoned.

[30] Foreign Application Priority Data

Jun. 30, 1984 [JP] Japan ............................... 59-134105

[51] Int. Cl.[4] ............................................... C23C 14/58

[52] U.S. Cl. .................................... 148/121; 148/122; 204/37.1; 204/192.2

[58] Field of Search ............... 148/121, 122; 204/37.1, 204/192.2

[56] References Cited

U.S. PATENT DOCUMENTS

| | | | |
|---|---|---|---|
| 3,886,052 | 5/1975 | Smith | 204/37.1 |
| 4,752,344 | 6/1988 | Jubb et al. | 204/192.2 |

FOREIGN PATENT DOCUMENTS

| | | | |
|---|---|---|---|
| 2126887 | 11/1972 | Fed. Rep. of Germany | 204/192.2 |
| 0136400 | 7/1979 | Fed. Rep. of Germany | |

OTHER PUBLICATIONS

Ahn et al., "Magnetic Oxide Film Deposition", IBM Technical Disclosure Bulletin, vol. 13, No. 10, Mar. 1971.

Cuomo et al., "Sputtering Garnet Compound Layer", IBM Technical Disclosure Bulletin, vol. 16, No. 4, Sep. 1973.

Bajorek et al., et al., "Cobalt Ferrite Films", IBM Technical Disclosure Bulletin, vol. 19, No. 1, Jun. 1976.

Reith et al., "Evaporated NiFe/$Al_2O_3$ Structure", IBM Technical Disclosure Bulletin, vol. 27, No. 3, Aug. 1984.

*Primary Examiner*—L. Dewayne Rutledge
*Assistant Examiner*—David Schumaker
*Attorney, Agent, or Firm*—Flynn, Thiel, Boutell & Tanis

[57] ABSTRACT

A method of preparing an oxygen-containing ferromagnetic amorphous alloy comprising the step of: sputtering an oxygen-containing composite target composed of an oxide and a metal or metal alloy, thereby forming a film of the amorphous alloy on a substrate, the amorphous alloy consisting of:

$$M_xG_yO_z$$

where M is one or more transition metals of Fe, Co and Ni; or a combination of the transition metal or metals and one or more metals selected from the group consisting of V, Cr, Mn, Nb, Mo, Hf, Ta, W, Pt, Sm, Gd, Tb, Dy and Ho; G is one or more elements selected from the group consisting of B, Ge, As, Sb, Ti, Sn and Zr; oxygen (O) is supplied by the oxide; and x, y and z are the atomic percentages of M, G and O and x+y+z=100, the composition of the amorphous alloy being in the pentagonal hatched zone in FIG. 1 and the pentagonal zone being defined by the lines joining the points of A (80, 19, 1), B (50, 49, 1), C (36, 36, 28), D (36, 4, 60) and E (38.5, 1.5, 60) shown in FIG. 1.

32 Claims, 17 Drawing Sheets

OXYGEN-CONTAINING FERROMAGNETIC AMORPHOUS ALLOY AND METHOD OF PREPARING THE SAME

CROSS-REFERENCE TO RELATED APPLICATION

This is a division of Ser. No. 011,646, filed Feb. 4, 1987, which is a continuation-in-part of Ser. No. 747,132, filed June 20, 1985, abandoned.

BACKGROUND OF THE INVENTION

The present invention relates to oxygencontaining amorphous alloys having superior properties as ferromagnetic materials and, further, a method of preparing the same.

In the field of metallic materials, amorphous alloys containing as main constituent components elements of transition metals of Group 3d in the Periodic Table and metalloid elements, such as B or Si, have been well-known as typical ferromagnetic materials and have been greatly desired as new metallic materials because of their advantageous properties, particularly with regard to magnetic properties, mechanical properties and corrosion resistance. On the other hand, there has been a growing demand for ferromagnetic transparent glass in the field of ceramics. Heretofore, various studies or attempts have been made on ferromagnetic amorphous oxides, but they are limited only to paramagnetic and antiferromagnetic materials. Thus, ferromagnetic amorphous oxide materials have not been successfully provided in this field.

Recently, ferromagnetic amorphous oxides were proposed in Japanese patent application Laid-Open No. 58-64264. The new ferromagnetic amorphous oxides were provided in the form of a ribbon, the ribbon being prepared by heating to melt a mixture consisting of various ferrites with a spinel structure and glass-forming oxides, mainly $P_2O_5$, and then splat cooling the molten mixture to solidify same. The saturation magnetization of the ferromagnetic amorphous oxide at room temperature is still small as compared to that of spinel ferrite and thus a more increased saturation magnetization is required for the practical uses. However, unfortunately, the preparation method proposed in the Japanese patent application can provide the ferromagnetic amorphous oxide only in an extremely limited composition range and such a limited composition range is disadvantageous to improve ferromagnetic properties.

SUMMARY OF THE INVENTION

It is therefore an object of the present invention to provide oxygen-containing amorphous alloys having a quite novel structure which are highly valuable as ferromagnetic materials, wherein the oxygen content is variable over a wide compositional range.

Another object of the present invention is to provide a method of preparing the above novel ferromagnetic amorphous alloys over an expanded composition range.

According to the present invention, there is provided an oxygen-containing ferromagnetic amorphous alloy which is represented by the general formula:

$$M_xG_yO_z$$

wherein M is one or more elements of the transition metals Fe, Co and Ni; or a combination of the transition element or elements and one or more elements selected from the group consisting of V, Cr, Mn, Nb, Mo, Hf, Ta, W, Pt, Sm, Gd, Tb, Dy and Ho; G is one or more elements selected from the group consisting of B, Si, Ge, As, Sb, Ti, Sn, Al and Zr; and x, y and z are the fractional atomic percentages of M, G and O (oxygen) of the alloy totalling 100, i.e., $x+y+z=100$.

In the ferromagnetic amorphous alloy specified above, when the composition of the alloy is represented as (x, y, z) in the triangular ternary diagram of the accompanying FIG. 1, the composition region should be in the range of the pentagonal area enclosed by the lines joining the points of A (80, 19, 1), B (50, 49, 1), C (36, 36, 28), D (36, 4, 60) and E (38.5, 1.5, 60) in the same figure. Further, the oxygen component of the alloy is introduced from the target oxide material. An oxygen content of 1% or less is not regarded as significant, because an error of up to 1% of oxygen is allowable in the analysis of the composition.

Further, according to the present invention, there is provided a method for preparing the oxygencontaining ferromagnetic amorphous alloy specified above, the method comprising forming a film of the amorphous alloy by a well-known process, such as rf sputtering, magnetron sputtering or ion beam sputtering, and then, optionally, heat treating the film at a temperature below the crystallization temperature of the amorphous alloy.

The amorphous alloys of the present invention possess useful ferromagnetic properties, particularly with respect to high saturation magnetization and high squareness ratio, high electrical resistivity, and excellent light transmittancy, in the wide compositional region, that is, the pentagonal area ABCDE in the triangular diagram of the accompanying FIG. 1, and thus are highly valuable as new ferromagnetic materials.

of the Fe atom, with changes in "x", in the formula $Fe_xB_yO_z$. For purposes of comparison, the broken lines show the ratios of the intensities for $Fe_3O_4$, $Fe_2O_3$ and Fe (also $Fe_{80}B_{20}$).

Figure 20:
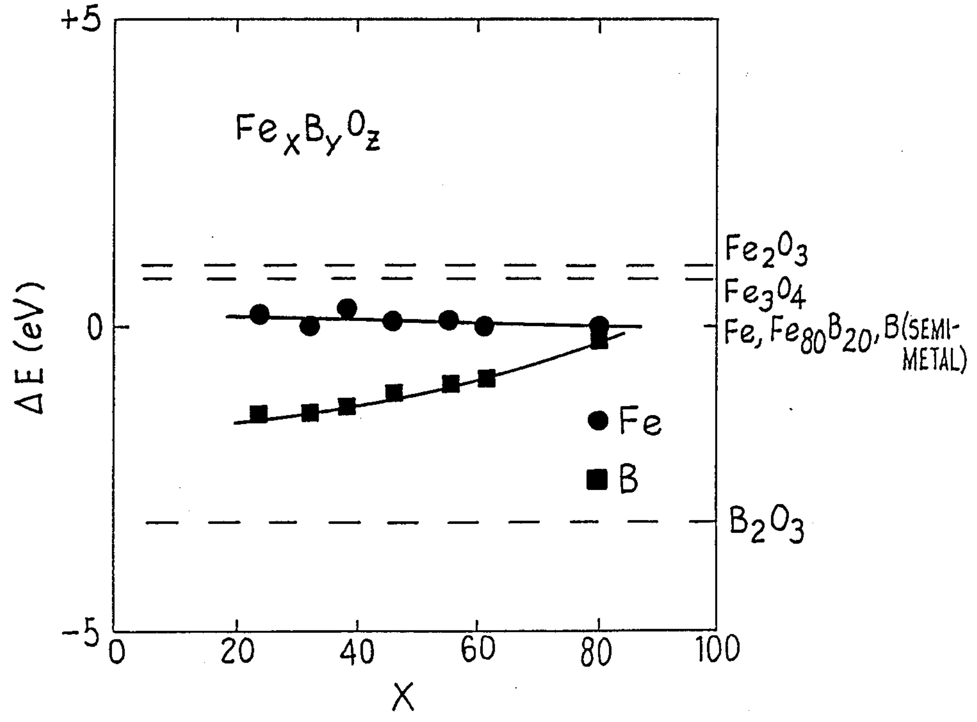

FIG. 20 is a graph showing the change in ΔE(eV) with changes in x in the alloy $Fe_xB_yO_z$, for the Fe atom and the B atom of Applicant's alloy. The broken lines show the values for $Fe_2O_3$, $Fe_3O_4$ and $B_2O_3$. Also the values for Fe and Fe80B20 and B are shown.

Figure 21:
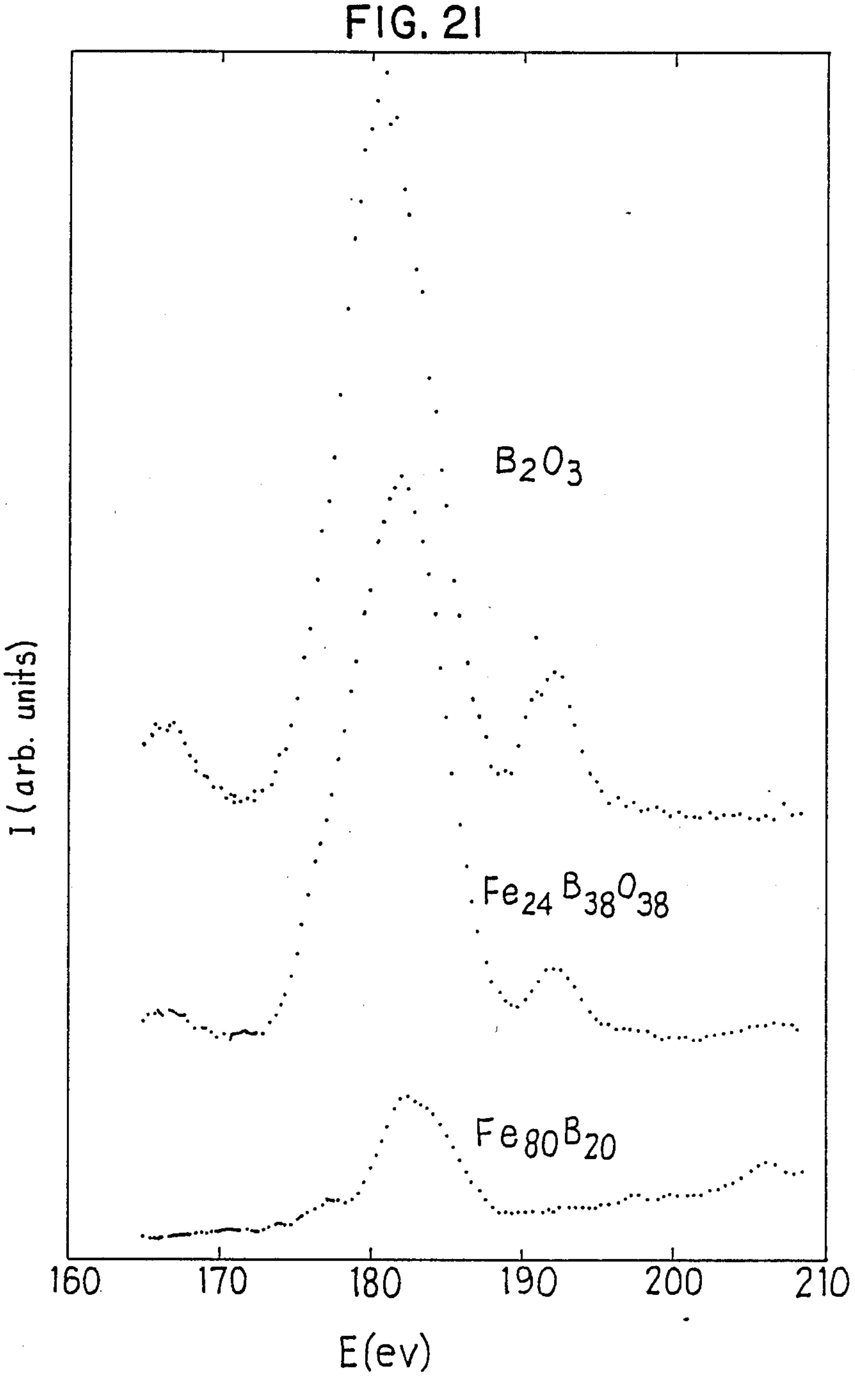

FIG. 21 is a graph showing the spectra of the $K_\alpha$line of the metallic alloy $Fe_{80}B_{20}$, the alloy thin film of $Fe_{24}B_{38}O_{38}$ and $B_2O_3$.

DETAILED DESCRIPTION OF THE PREFERRED EMBODIMENTS

The first feature of the present invention resides in a ferromagnetic amorphous alloy containing oxygen over a wide content range which is defined by the general formula M given above. In the above general formula, M is one or more elements of well-known typical ferromagnetic metals. The element or elements represented by G combines with the metallic element or elements represented by M and oxygen to yield a glassy oxide or an amorphous alloy. The present invention was made by using effectively this property in order to obtain the desired amorphous polynary alloys.

Oxygen (O) is effective to expand the composition range capable of developing amorphous polynary alloys and improves the magnetic properties, corrosion resistance, mechanical properties and light transmittancy. Further, oxygen is effective to increase the resistivity.

Figure 1:
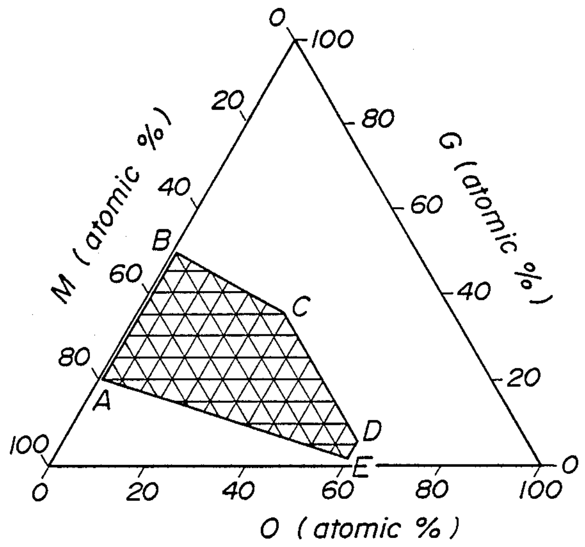
FIG. 1 is a diagram defining the composition region of the ferromagnetic amorphous phase of the pseudo ternary system alloy, represented by $M_xG_yO_z$, according to the present invention.

The composition region of the ferromagnetic amorphous phase is schematically shown, as a pseudo ternary system, in the shaded area in FIG. 1. The reason why the ferromagnetic amorphous phase is stated as a pseudo ternary system is that the components M and G each can comprise two or more elements in certain cases.

In practice of the present invention, the ferromagnetic amorphous alloys having the wide composition range can be prepared in a film form by a conventional technique, but, preferably, the alloys are prepared by sputtering, that is, rf sputtering, magnetron sputtering, ion beam sputtering and so on, using a composite target or targets. As the composite target, the following combinations can be employed in the present invention.

(1) Composite target composed of a glass-forming oxide compound and a metal; said compound and an alloy; or said compound and an amorphous phase-forming alloy.

(2) Composite target composed of an oxide compound and an amorphous phase-forming alloy; and (3) Composite target composed of a powdered oxide mixture containing a glass-forming oxide compound and metal or the powdered oxide mixture and an alloy.

In the composite targets, the glass-forming oxide compound is selected from the group consisting of $B_2O_3$, $SiO_2$, $GeO_2$, $As_2O_3$, $Sb_2O_3$, $TiO_2$, $SnO_2$, $Al_2O_3$ and ZrO2 and the metal or alloy is selected from the transition elements of Fe, Co and Ni; or alloys of the transition element or elements with one or more elements selected from group consisting of V, Cr, Mn, Nb, Mo, Hf, Ta, W, Pt, Sm, Gd, Tb, Dy and Ho. Further, the amorphous phase-forming alloy is selected from the alloys of one or more metals selected from the group consisting of V, Cr, Mn, Fe, Co, Ni, Nb, Mo, Hf, Ta, W, Pt, Sm, Gd, Tb, Dy and Ho and one or more elements selected from the group consisting of B, Si, Ge, As, Sb, Ti, Sn, Al and Zr. The oxide compound employed together with the amorphous phase-forming alloy can be selected from among the oxide compounds of V, Cr, Mn, Fe, Co, Ni, Nb, Mo, Hf, Ta, W, Pt, Sm, Gd, Tb, Dy and Ho and these oxides can also be contained in the powdered oxide mixture of the composite target (3).

In practicing the present invention, the foregoing targets are provided in two preferred forms. One is prepared by changing the number of sintered pellets of the glass-forming oxides or other oxides on the metal, the alloy or the amorphous phase-forming alloy and another one is prepared by placing the powdered oxide mixture containing the glass-forming oxide on the dish of the metal or alloy.

Since, in the method of the present invention, oxygen is supplied from the source oxide material, the film formation process is performed without externally supplied oxygen gas and forms a ferromagnetic amorphous alloy film having an unexpected novel structure composed of a metallic amorphous phase and an oxide compound amorphous phase. Various superior properties are obtained by the invention, which properties cannot be obtained in any amorphous ferromagnetic oxide films or ribbon prepared by a reactive sputtering process requiring an oxygen gas or splat quenching of an oxide melt.

Hereinafter, the present invention will be described in detail with reference to the Fe-B-O system, Co-B-O system and Fe-Cr-B-O system alloys, as representative examples.

(1) Fe-B-O system alloy

Figure 2:
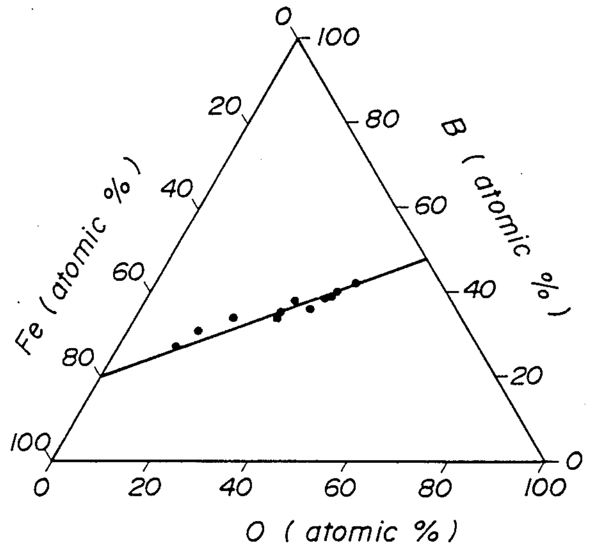
FIG. 2 is a diagram showing the compositional change of Fe-B-O ternary system amorphous alloy.

Fe-B-O alloy films were prepared by rf sputtering in an argon atmosphere using a composite target comprising Fe-B alloy and sintered pellets of glass-forming oxide ($B_2O_3$). The compositional change due to changes in the argon gas pressure and the number of the sintered $B_2O_3$ pellets is shown in FIG. 2. The proportion of each constituent element was quantitatively determined by using Electron Probe X-Ray Micro Analysis (EPMA).

When the compositional change shown in FIG. 2 is extrapolated to the B-O axis along with increases in oxygen and boron, the composition at the extrapolation point does not always give the stoichiometric ratio of B and O of $B_2O_3$, but rather, gives an excess boron content. The excess boron content suggests that B may be present not only in a chemical bond of $B_2O_3$, but also in another state.

Figure 3:
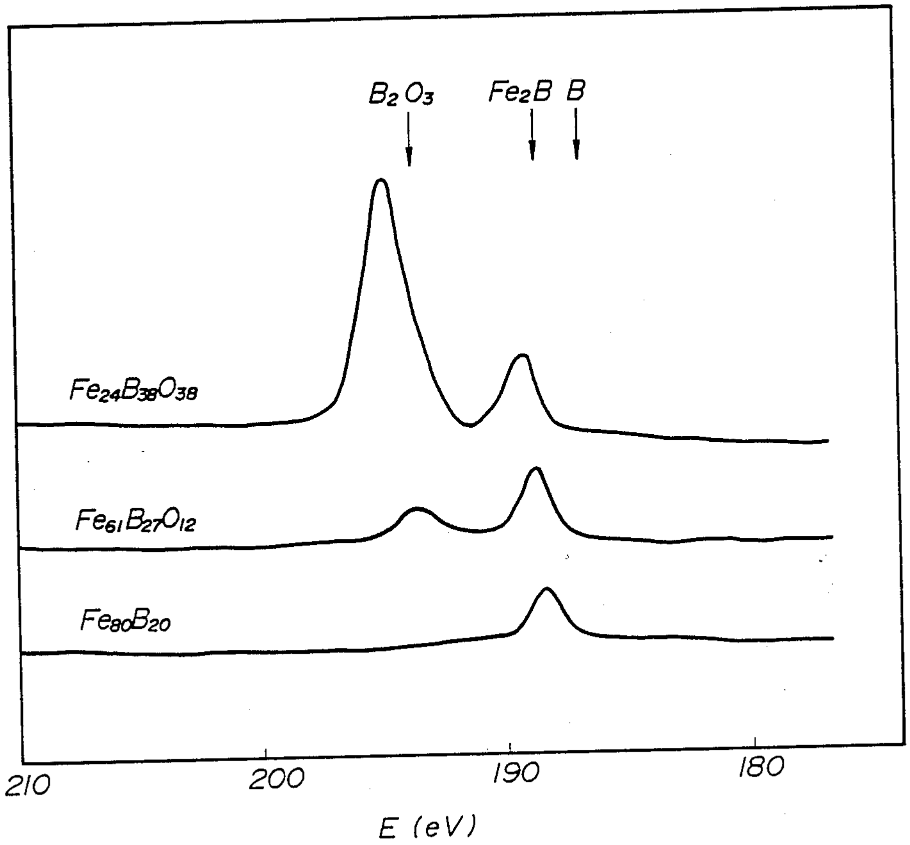
FIG. 3 is a graph of the results of analysis by ESCA for the state of ls electrons of boron.
Figure 4:
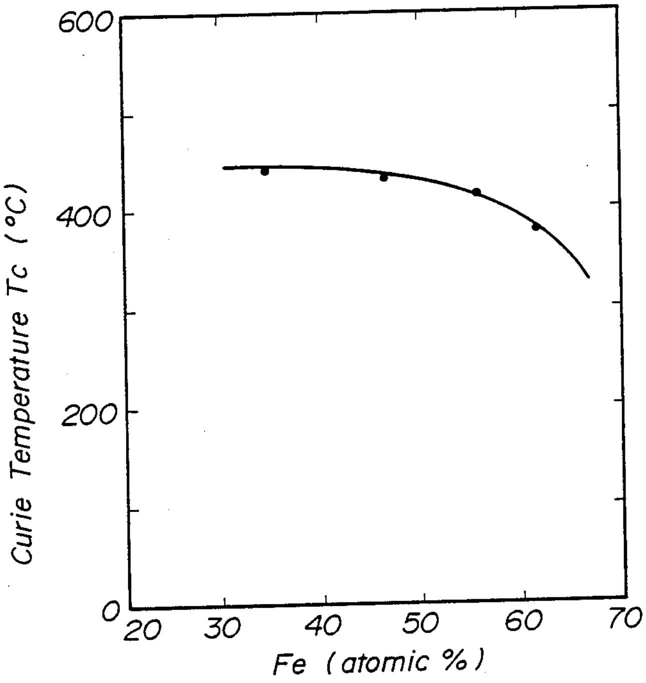
FIG. 4 is a graph showing the change in curie temperature (Tc) with changes in the concentration of Fe for Fe-B-O amorphous film.

The chemical state of boron (B) was analyzed by using Electron Spectroscopy for Chemical Analysis (ESCA) and the result of the analysis is shown in FIG. 3. As will be seen from FIG. 3, ls electrons of B have two distinct peaks corresponding to two different chemical bonding states, i.e., a metallic chemical bonding state and an oxide chemical bonding state which almost correspond to boron in the chemical bonding states of an amorphous alloy of $Fe_{80}B_{20}$ and B of a glassy oxide of $B_2O_3$, respectively. However, considering that these two separate peaks of B are shifted due to the changes in the composition and, as shown in FIG. 4, curie temperatures are also changed due to the compositional change, it can be concluded that the amorphous alloy of the present invention is not a simple amorphous structure consisting of two separate phases, but rather, is an unexpected novel amorphous structure composed of a metallic amorphous phase and an oxide compound amorphous phase.

Figure 5:
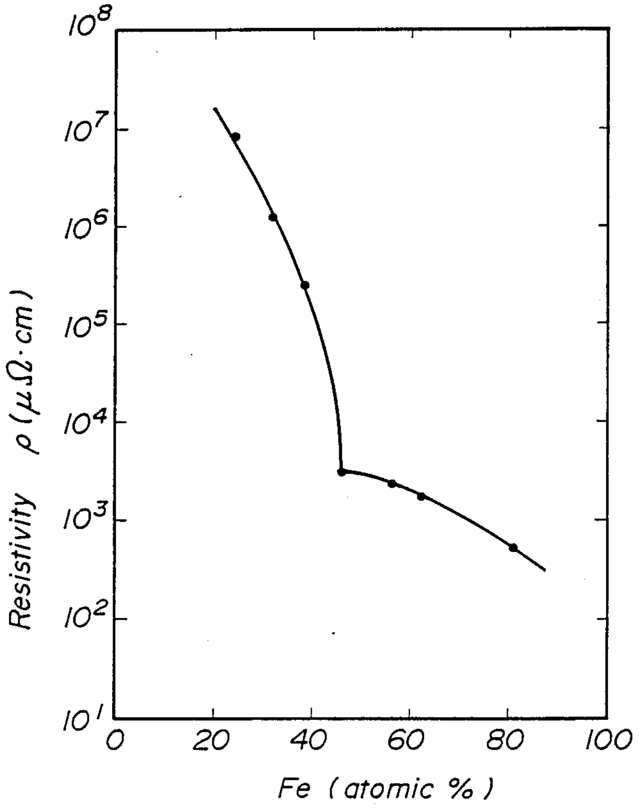
FIG. 5 is a graph plotting resistivity (at room temperature) versus Fe concentration for Fe-B-O amorphous alloy film.

FIG. 5 is a graph plotting resistivity at room temperature versus atomic percentage of Fe for the resulting Fe-B-O system alloy. As can be seen from this graph, an anomalous change in resistivity was detected at the Fe concentration of approximately 45%. Such change suggests a structural change in a quite novel amorphous phase and the structural change cannot be expected from the continuous change of an ordinary amorphous structure. This characteristic change is also supported by its low-angle scattering of intensity x-rays given in FIG. 6. A considerable change of x-ray intensity in an area of low-angle scattering of x-ray was observed in the vicinity of the composition corresponding to the resistivity at the flection point referred to in FIG. 5 and this change proves that the structural change takes place in a larger range than the short range such as nearest neighbor atoms. A high resistivity about $10^6\mu\Omega$.cm was obtained in the composition at the boundary between the ferromagnetic phase and superparamagnetic phase, i.e., in the composition containing about 35% of Fe.

In order more specifically to describe the chemical bonding states of the amorphous alloy according to the invention, the thin film of the Fe-B-O system amorphous alloy, represented by $Fe_xB_yO_z$, is described as a typical embodiment of the invention and the experimental data of analysis of that alloy by EPMA (Electron Probe Micro Analyzer) is set forth.

Figure 19:
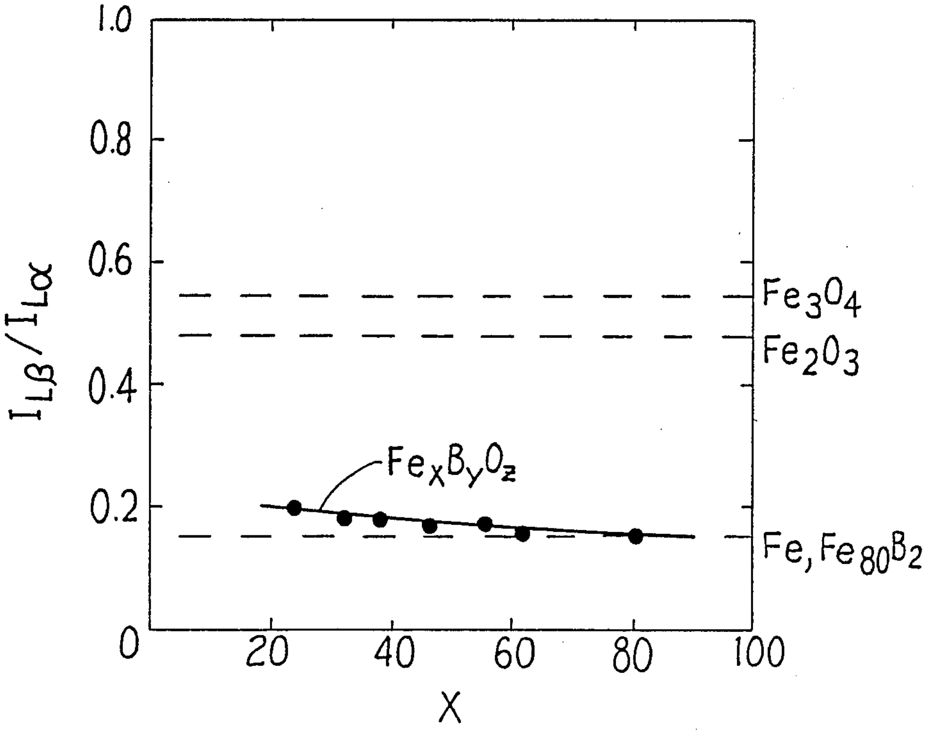
FIG. 19 is a graph plotting the changes in the ratio of intensities of $L_\alpha$and $L_\beta$lines $$\frac{I_{L\beta}}{I_{L\alpha}}$$

FIG. 19 shows the chemical bonding state of the Fe atom in $Fe_xB_yO_z$ by means of the ratio of the intensities of $L_\alpha$ line to $L_\beta$ line. As shown in FIG. 19, the chemical bonding state of the Fe atom in the claimed amorphous alloy is entirely different from the chemical bonding state of the Fe atom in Fe oxides ($Fe_2O_3$ and $Fe_3O_4$) When $50 \leqq x \leqq 80$, the chemical bonding state of the Fe atom of the $Fe_xB_yO_z$ alloy is almost the same as the chemical bonding states of Fe atoms in metal Fe and amorphous $Fe_{80}B_{20}$. When x is below 50, the chemical bonding state of the Fe atom of the $Fe_xB_yO_z$ alloy is slightly shifted from the bonding states of metal Fe and $Fe_{80}B_{20}$.

FIG. 20 is a graph showing the chemical shifts of the Fe atom and B atom of the amorphous alloy according to the invention. The graph also shows that Fe is present in almost the same chemical bonding states as in metal Fe and in an amorphous alloy of $Fe_{80}B_{20}$. The foregoing experimental data establishes that the Fe atoms of the amorphous alloy according to the invention are present only in a chemical bonding state of a metal, rather than a chemical bonding state of an oxide.

FIG. 21 shows the spectra of Kα line of boron (B) atom of metallic alloy of $Fe_{80}B_{20}$, the invention amorphous alloy thin film of Fe and the oxide of $B_2O_3$. It can be observed from FIG. 21 that the spectrum of B of the invention alloy thin film is almost the same as that of $B_2O_3$, as can be seen from the primary peak and the two secondary peaks on both sides of the primary peak, and, thus, in the invention alloy the B atom is in a chemical bonding state of an oxide. Further, as will be apparent from FIG. 20, the B atom is oxidized with an increase in oxygen content in the invention amorphous alloy. On the other hand, as previously stated, the $B_2O_3$, atom also forms a chemical bonding state of metal with Fe, besides the chemical bonding state of oxide. (Refer to FIG. 3).

Figure 6:
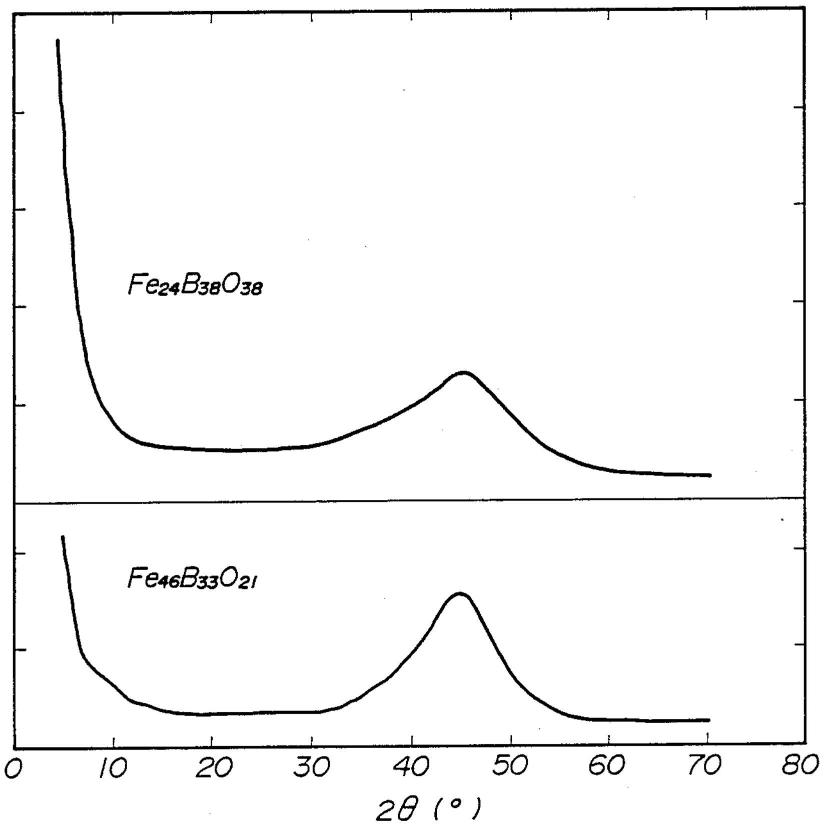
FIG. 6 is a graph showing the intensity of x-ray diffraction for Fe-B-O amorphous films.

As set forth above, the foregoing two different chemical bonding states of metal and oxide are coexistent in the claimed alloy and, as shown in FIG. 6, the alloy is wholly amorphous but is quite different from any known amorphous alloy. Further, in the invention ferromagnetic amorphous alloy, the Fe atom is present in a bonding state of metal and the B atom is present in the two different bonding states of metal and of oxide. Such bonding states produce very advantageous effects. Namely, since Fe, which is a main constituent element, is present only in the metallic bonding state in the claimed compositional range, an unexpectedly high saturation magnetization can be obtained. On the other hand, an increase in the oxide bonding state of boron results in highly increased electrical resistivity and light transmittancy.

In the foregoing, only the alloy $Fe_xB_yO_z$ is discussed, but the other elements for M and G in the general formula behave the same way.

Figure 7:
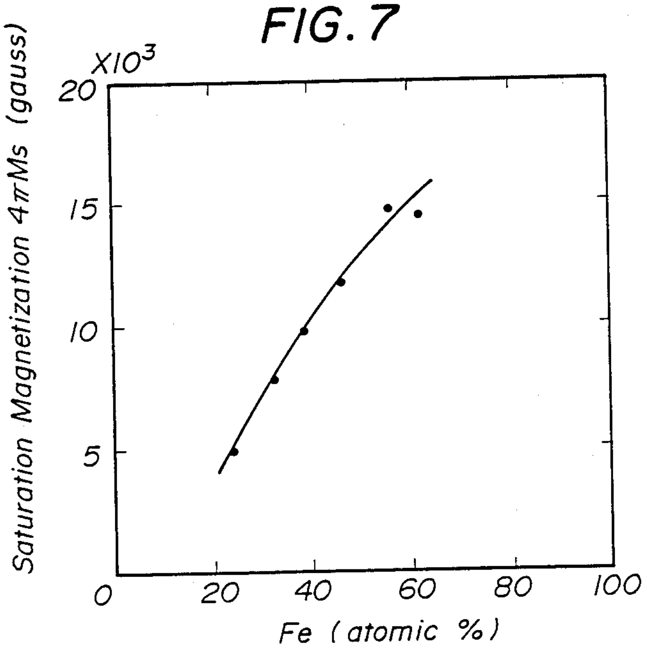
FIG. 7 is a graph showing the variation in saturation magnetization $4\pi Ms$ (at room temperature) due to changes in the concentration of Fe for Fe-B-O amorphous film.
Figure 8:
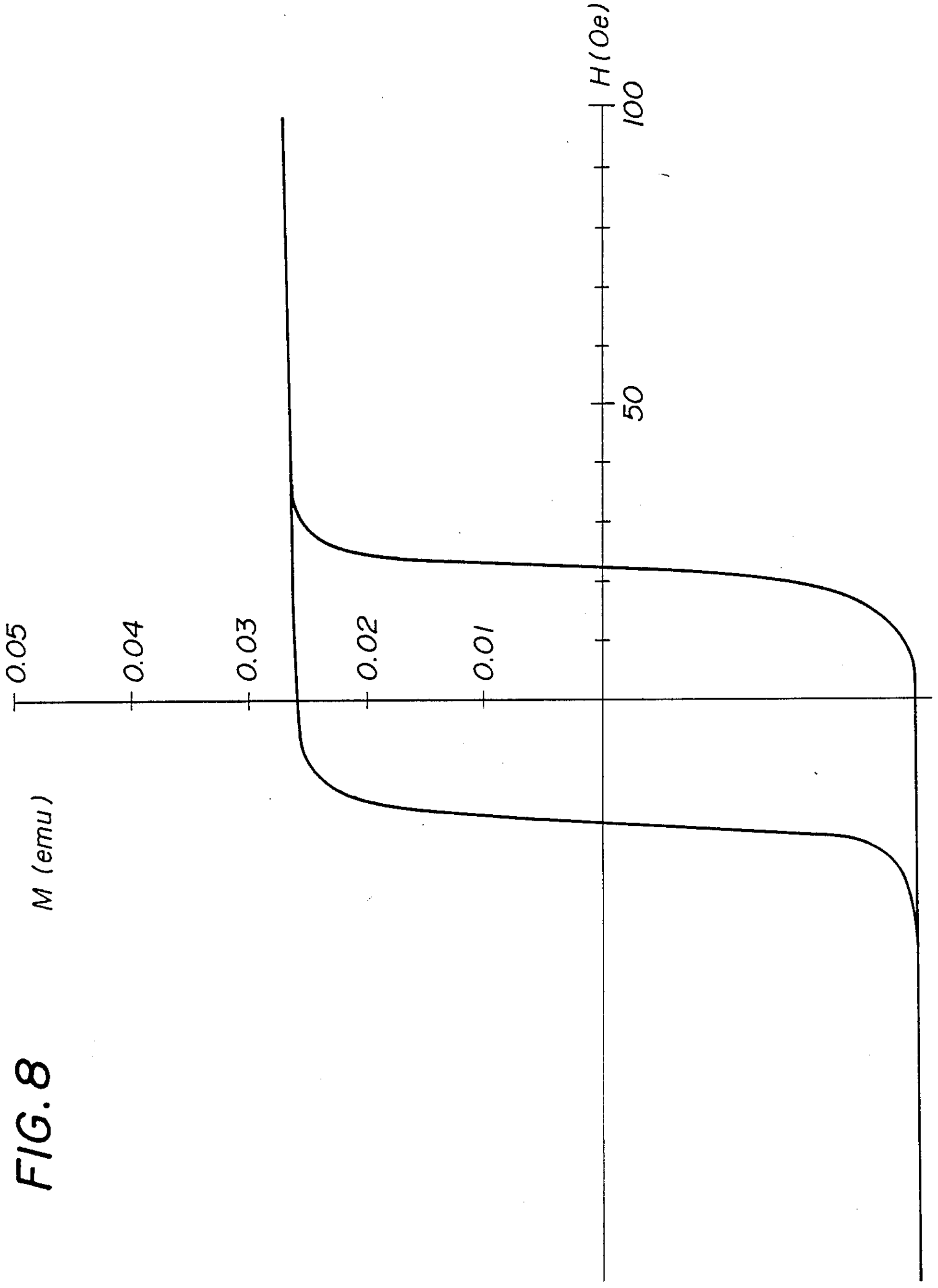
FIG. 8 is the magnetic hysteresis loop (at room temperature) of an Fe-B-O amorphous film.

FIG. 7 is a graph plotting saturation magnetization $4\pi Ms$ at room temperature versus Fe content (by atomic percent). As can be seen from this figure, the ferromagnetic amorphous alloy of the present invention exhibits a high saturation magnetization of 14000 to 15000 gauss in the Fe content of about 60% which cannot be obtained in any conventional ferrite or ferromagnetic amorphous oxide. Further, as shown in FIG. 8, it is possible to readily obtain a ferromagnetic amorphous oxide exhibiting a high squareness ratio more than 90% in the magnetic hysteresis loop, without requiring any heat treatment.

Figure 9:
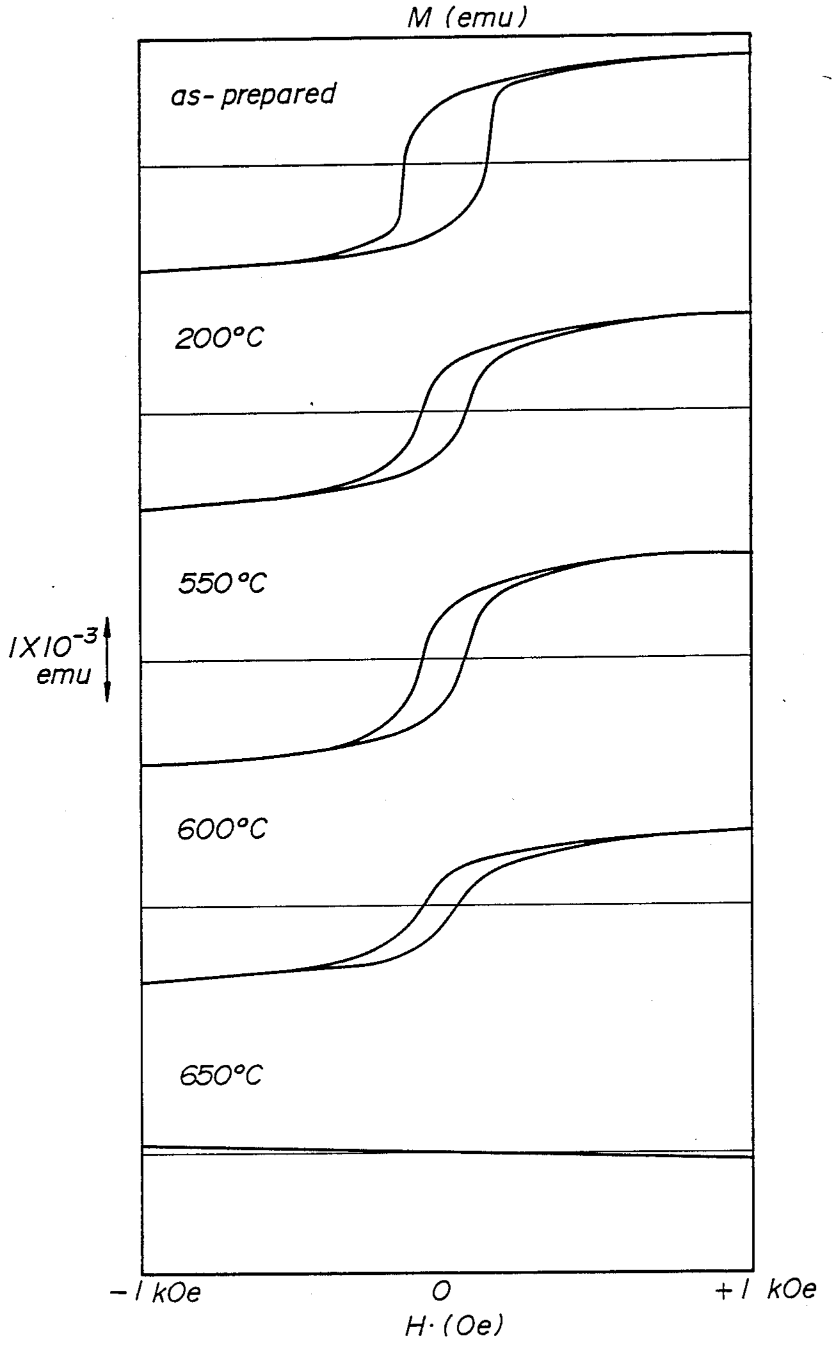
FIG. 9 shows the variations in magnetic hysteresis loop due to heat treatments in air for an Fe-B-O amorphous film.
Figure 10:
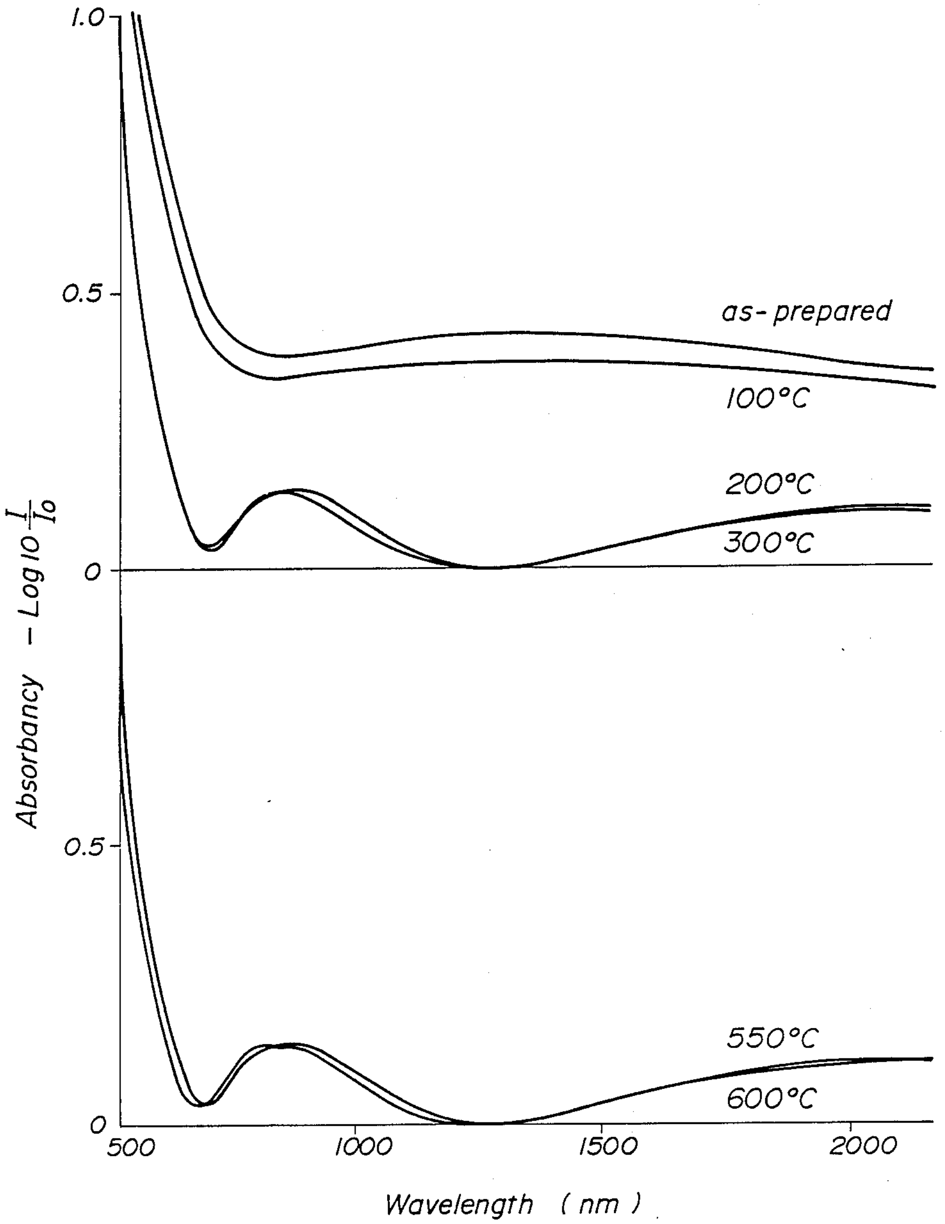
FIG. 10 shows the variations in absorbancy due to heat treatments in air for an Fe-B-O amorphous film.

Further Fe-B-O ferromagnetic amorphous alloy films were prepared by rf sputtering process using a composite target which was prepared by placing a powdered mixture of $Fe_2O_3$ and $B_2O_3$ into a Fe dish. FIGS. 9 and 10 show the changes in magnetic hysteresis loops and in absorbancy for the ferromagnetic amorphous alloys which were thermally treated at the given temperatures in the air and the untreated ferromagnetic amorphous alloy is indicated with "asprepared". As revealed in FIG. 10, the absorbency is quite suddenly reduced at a very low heat treatment temperature of 200° C. On the other hand, the hysteresis loops show no noticeable change below 600° C., i.e., until crystallization occurs, although the coercive force is reduced. Such results are based on the change in the valence of Fe ion. The result of analysis of the $L_\beta$ line of Fe with EPMA proved that the Fe ion was oxidized to $Fe^{3+}$. It was found from the above data that the present invention could greatly improve light transmittancy by oxidizing at low temperatures and thereby controlling the valence of the Fe ion, without causing crystallization or deleterious effect on the magnetic properties, and provide films having a high thermal stability. The magnetic properties of the Fe-B-O amorphous alloy film of this invention cannot be anticipated from antiferromagnetic properties of hematite $\alpha$-$Fe_2O_3$ in which the valence of the Fe ion is 3, and the fact supports the analysis that the amorphous Fe-B-O alloys have a novel amorphous structure which has not been recognized in any known amorphous oxides. Optically, since the Fe-B-O amorphous alloy is amorphous, double refraction associated with an optically anisotropic crystal is not observed and a large Faraday rotation angle may be expected.

(2) Co-B-O system alloy

Ferromagnetic amorphous films of Co-B-O alloy were prepared by rf sputtering process in an argon gas using a composite target consisting of Co metal and sintered pellets of glass forming oxide ($B_2O_3$).

Figure 11:
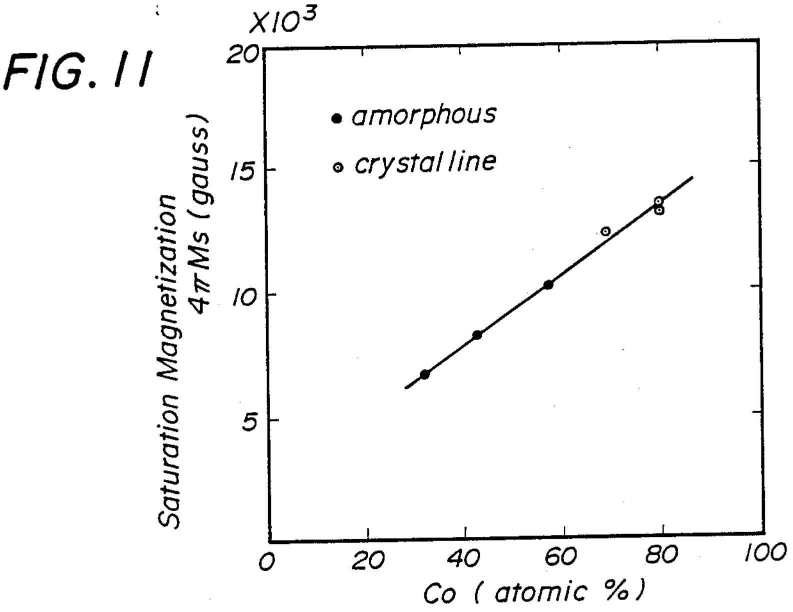
FIG. 11 is a graph showing the change in saturation magnetization $4\pi Ms$ (at room temperature) with changes in the concentration of Co for Co-B-O amorphous film.

FIG. 11 is a graph showing the change in saturation magnetization at room temperature with changes in Co concentration by (atomic %) for the resulting film. In the preparation of this film, a compositional boundary between a crystalline region and an amorphous region is in the Co content of about 60%. The boundary composition with about 60% Co exhibited a high saturation magnetization level, i.e., about 10,000 gauss, as compared with known ferrites or ferromagnetic amorphous oxides.

Figure 12:
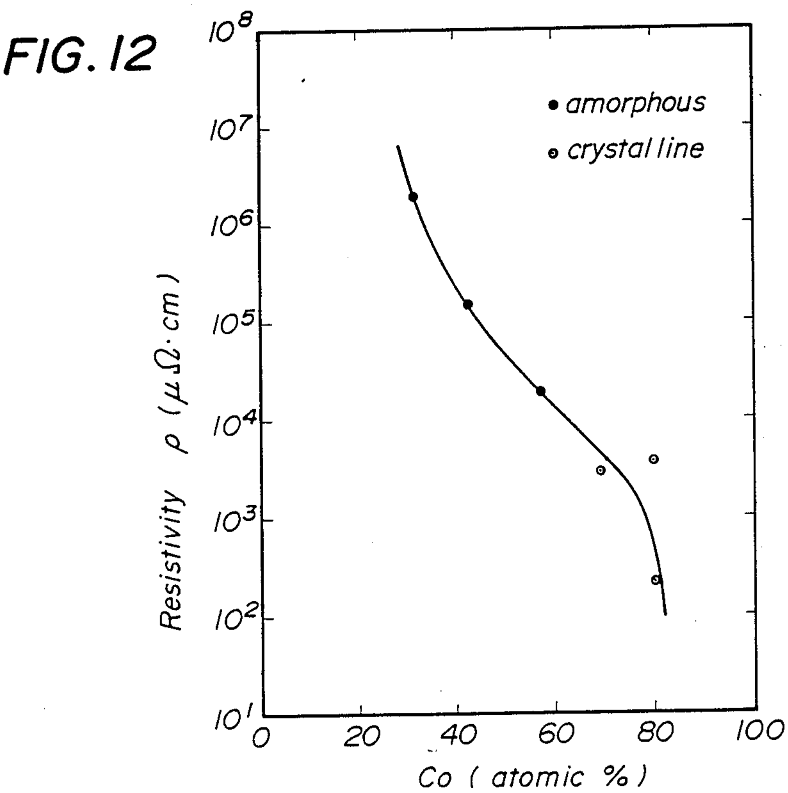
FIG. 12 is a graph showing the change in resistivity (at room temperature) with changes in the concentration of Co for Co-B-O amorphous film.

Further, as shown in FIG. 12, the ferromagnetic amorphous region shows a considerably high electric resistivity of the order of $10^5 \mu\Omega$.cm.

(3) Fe-Cr-B-O system alloy

Ferromagnetic amorphous films of Fe-Cr-B-O alloy were prepared by rf sputtering process in an argon gas, using Fe-B alloy and sintered Cr203 pellets as a composite target.

Figure 13:
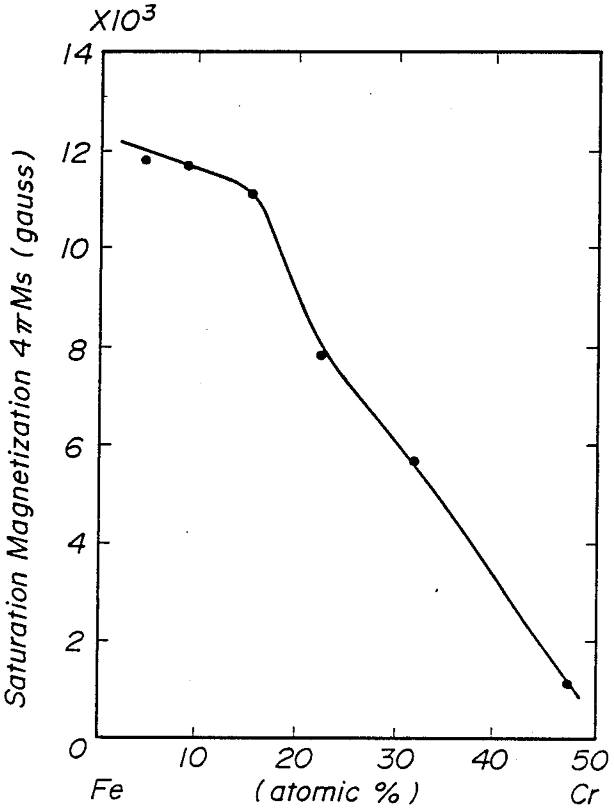
FIG. 13 is a graph showing the variation of saturation magnetization 4πMs (at room temperature) versus the compositional proportion of Fe and Cr for Fe-Cr-B-O amorphous film.
Figure 14:
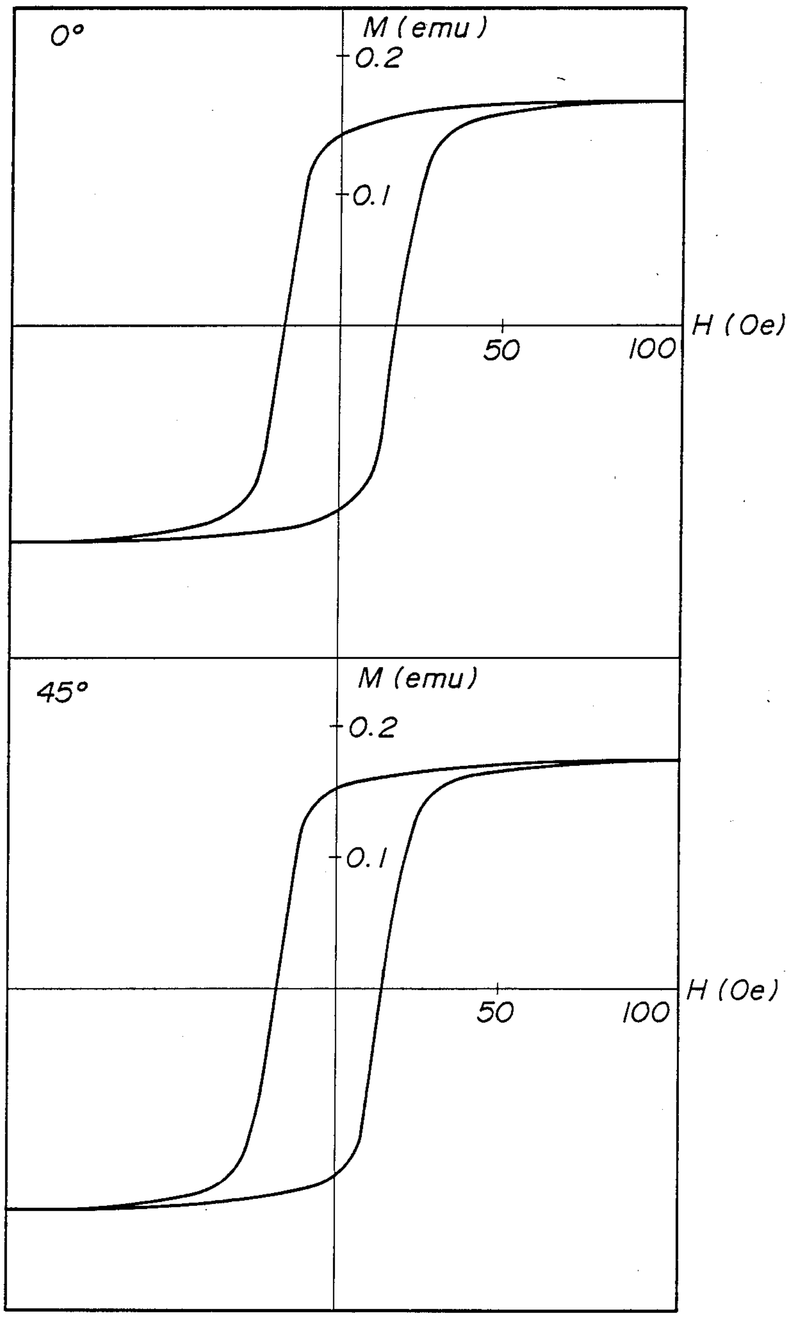
FIG. 14 shows the isotropic hysteresis loops (in-plane 0° direction and in-plane 45° direction) at room temperature for Fe-Cr-B-O amorphous film.
Figure 15:
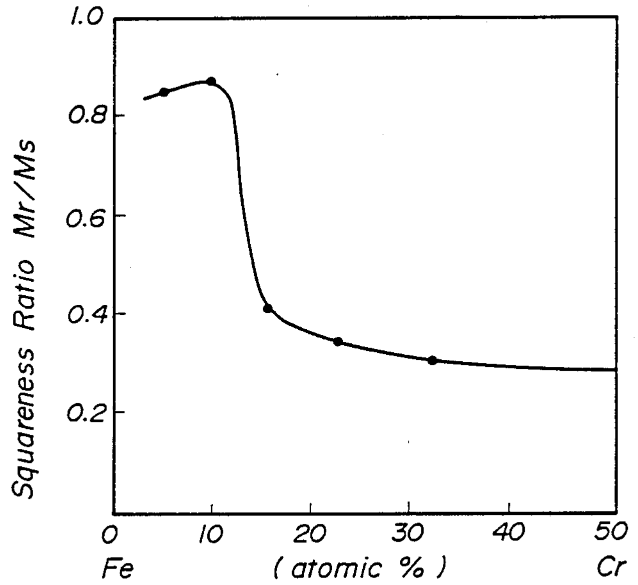
FIG. 15 is a graph plotting the change in squareness ratio (at room temperature) with changes in the proportion between Fe and Cr for Fe-Cr-B-O amorphous film.
Figure 16:
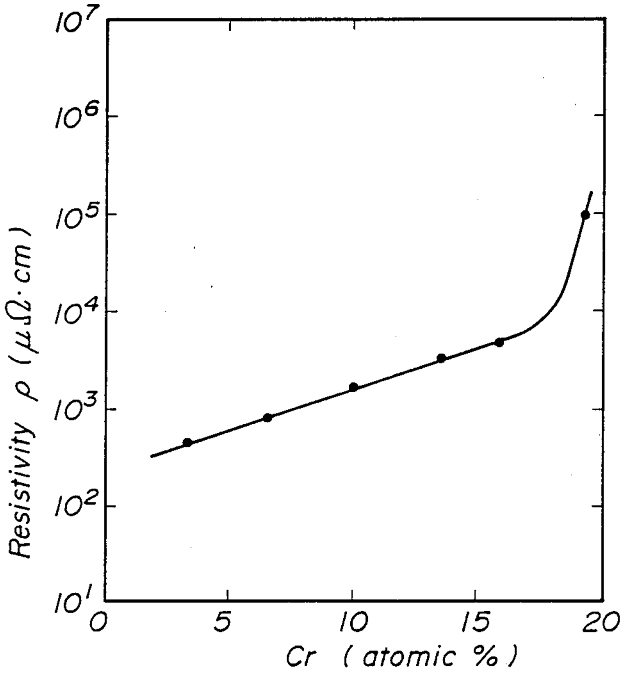
FIG. 16 is a graph plotting the change in resistivity (at room temperature) with changes in the concentration of Cr for Fe-Cr-B-O amorphous film.
Figure 17:
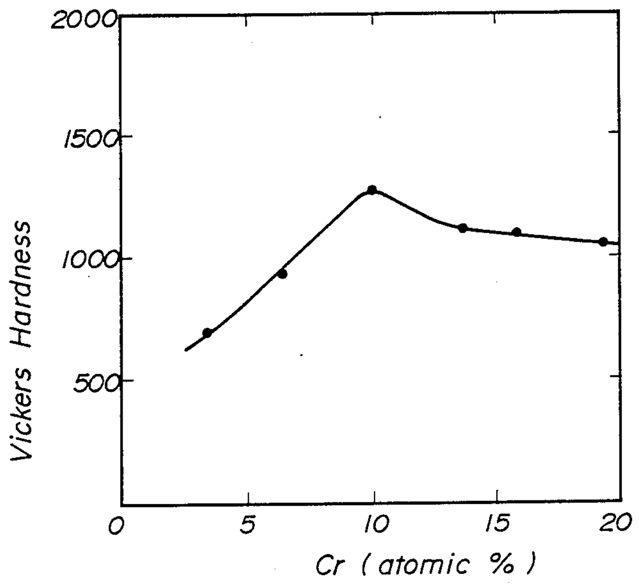
FIG. 17 is a graph plotting the change in Vickers hardness (at room temperature) with changes in Cr concentration for Fe-Cr-B-O amorphous film.
Figure 18A:
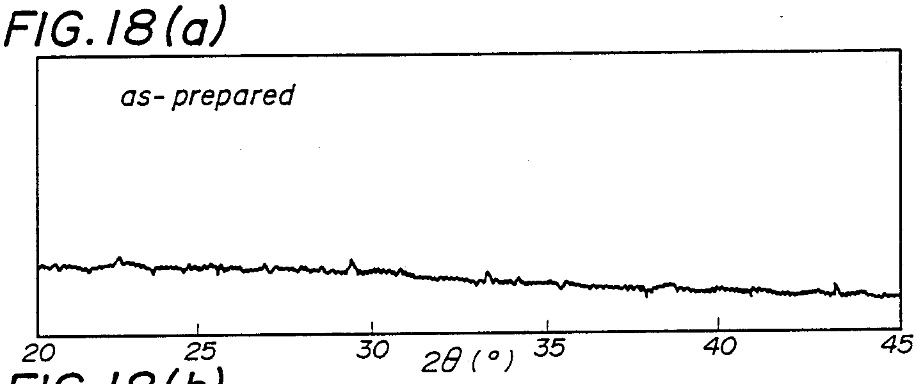
FIGS. 18(*a*) to 18 (*d*) are the changes in x-ray diffraction patterns due to heat treatments in air for an Fe-B-O amorphous film.
Figure 18B:
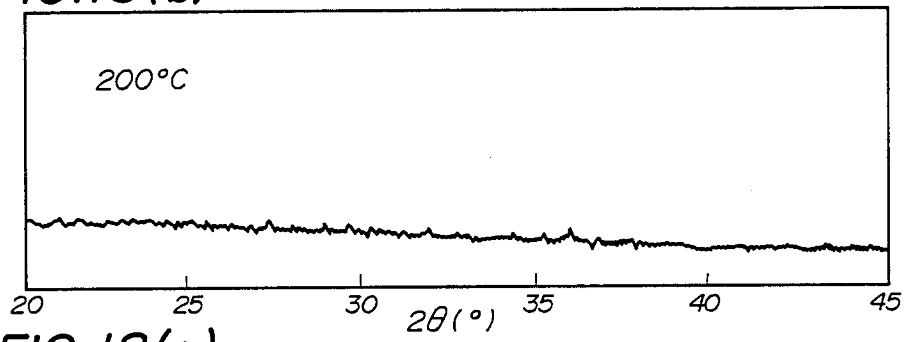
Figure 18C:
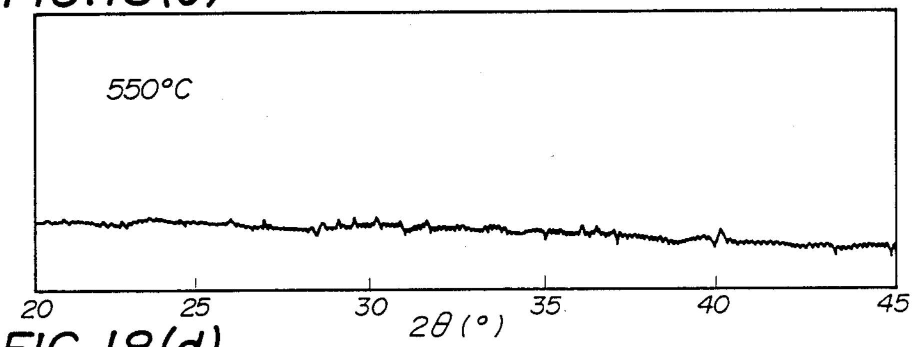
Figure 18D:
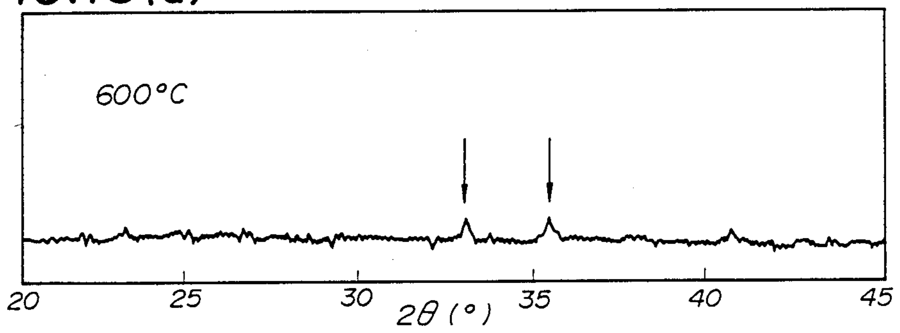

Usually, addition of Cr causes a considerable reduction in saturation magnetization. However, as will be noted from a graph in FIG. 13, in the case of the present invention, the reduction rate in saturation magnetization $4\pi Ms$ due to an addition of Cr is very slight and, for example, even with the Cr addition in a relatively large amount of 19%, a high saturation magnetization of higher than 10,000 gauss is maintained. The hysteresis loop of the alloy of this type is, as shown in FIG. 14, isotropic in the film and the squareness ratio is approximately 90% (FIG. 15). In addition to these superior magnetic properties, it is possible to obtain a high maximum resistivity of the order of $10^4 \mu\Omega$.cm in the ferromagnetic amorphous region (FIG. 16). The Vickers hardness of the alloy, as can be readily seen from FIG. 17, exhibited a maximum value of about 1300 in the Cr content of about 10% and is higher than that of other known oxides, for example, ferrite. The very high value is, for example, close to the maximum hardness of known amorphous alloys, e.g., 1400 of $Co_{34}Cr_{28}Mo_{20}C_{18}$ and thus is well comparable to the highest level hardness among metals or alloys.

Further, it is well known that iron-chromium amorphous alloys (for example, Fe-Cr-P-C alloys) containing Cr in an amount of 8% or more form a passive state layer on their surfaces, thereby improving their corrosion resistance. Thus, high corrosion resistance can be also expected in the ferromagnetic amorphous Fe-Cr-B-O alloys set forth above, because the alloys may also contain up to 17% chromium.

Examples of the present invention will now be described in detail by referring to three different types of amorphous alloy films of $Fe_xB_yO_z$, $Co_xB_yO_z$ and $(FeCr)_xB_yO_z$.

Amorphous alloy films were prepared under the conditions specified below.

a. $Fe_xB_yO_z$ Amorphous Film

EXAMPLE 1

Process for preparation: rf sputtering process between two electrodes

- Target: Composite target comprising a Fe disc (diameter: 82 mm; thickness: 5 mm) having sintered $B_2O_3$ pellets (diameter: 10 mm, thickness 5 mm) thereon Substrate: Quarts glass (size: 40 mm$\times$40 mm, thickness: 0.7 mm); or Pyrex Glass (registered trademark, size: 50 mm$\times$50 mm, thickness: 0.5 mm)
- Anode voltage: 1.0 kV
- Anodic current: 75 to 78 mA
- Injection power: 52 to 55W
- Reflection power: 4 to 6W
- Degree of ultimate vacuum: $1.5\times10^{-7}$ to $3.0\times10^{-7}$ torr
- Pressure of argon: $9.0\times10^{-2}$ torr
- Applied magnetic field: 50 Oe
- Means of controlling substrate temperatures: by watercooling
- Distance between electrodes: 40 mm
- Pre-sputtering time: 2 to 3 hours
- Sputtering time: 5 to 7 hours
- Method for varying film composition: by changing the number of the $B_2O_3$ pellets.

EXAMPLE 2

Process for preparation: rf sputtering process between two electrodes

- Target: Composite target comprising a $Fe_{83}B_{17}$ alloy disc (diameter: 65 mm, thickness: 6 mm) having sintered $B_2O_3$ pellets (diameter: 10 mm, thickness: 5 mm) thereon
- Substrate: Quartz glass (size: 40 mm$\times$40 mm, thickness: 0.7 mm); Pyrex Glass (registered trademark, size: 50 mm$\times$50 mm, thickness; 0.5 mm); or single crystal silicon (diameter: 60 mm, thickness: 0.55 mm)
- Anode voltage: 0.9 kV
- Anodic current: about 85 mA
- Injection power: 40 to 50W
- Reflection power: 10 to 15W
- Degree of ultimate vacuum: $1.5\times10^{-7}$ to $3.0\times10^{-7}$ torr
- Pressure of argon: $1.5\times10^{-2}$ to $11.5\times10^{-2}$ torr
- Applied magnetic field: 0 Oe
- Means of controlling substrate temperatures: by watercooling
- Distance between electrodes: 40 mm
- Pre-sputtering time: 2 to 3 hours
- Sputtering time: 2 to 10 hours
- Method for varying film composition: by changing the number of the $B_2O_3$ pellets or the argon pressure.

EXAMPLE 3

Process for preparation: rf sputtering process between two electrodes

Target: Composite target comprising a $Fe_{83}B_{17}$ alloy disc (diameter: 65 mm, thickness: 6 mm) having sintered $B_2O_3$ pellets (diameter: 10 mm, thickness: 5 mm) thereon Substrate: Quartz glass (size: 40 mm×40 mm, thickness: 0.7 mm); Pyrex Glass (registered trademark, size: 50 mm×50 mm, thickness: 0.5 mm); or single crystal silicon (diameter: 60 mm, thickness: 0.5 mm)

Anode voltage: 1.0 kV

Anodic current: 50 to 80 mA

Injection power: 45 to 65W

Reflection power: 15 to 20W

Degree of ultimate vacuum: $1.5\times10^{-7}$ to $3.0\times10^{-7}$ torr

Pressure of argon: $3.5\times10^{-2}$ to $11.5\times10^{-2}$ torr

Applied magnetic field: 50 Oe

Means of controlling substrate temperatures: by water-cooling

Distance between electrodes: 40 mm

Pre-sputtering time: 2 to 3 hours

Sputtering time: 3 to 6 hours

Method for varying film composition: by changing the number of the $B_2O_3$ pellets and the argon pressure.

EXAMPLE 4

Process for preparation: rf sputtering process between two electrodes

Target: Composite target comprising oxide powder mixture of $(Fe_2O_3)_{80-60}$ $(B_2O_3)_{20-40}$ placed in a Fe dish (diameter: 82 mm, height: 4 mm)

Substrate: Corning glass (Code 0211, size: 50 mm×50 mm thickness: 0.5 mm) or single crystal silicon (diameter: 60 mm, thickness: 0.5 mm)

Anode voltage: 1.2 kV

Anodic current: 120 mA

Injection power: 95 W

Reflection power: 10 W

Degree of ultimate vacuum: $1.5\times10^{-7}$ to $3.0\times10^{-7}$ torr

Pressure of argon: $9.0\times10^{-2}$ torr

Applied magnetic field: 0 Oe

Means of controlling substrate temperatures: by watercooling

Distance between electrodes: 40 mm

Pre-sputtering time: 2 to 3 hours

Sputtering time: 3 to 6 hours

Method for varying film composition: by varying the proportion of $Fe_2O_3$ and $B_2O_3$ of the oxide powder mixture.

b. $Co_xB_yO_z$ Amorphous Film

EXAMPLE 5

Process for preparation: rf sputtering process between two electrodes

Target: Composite target comprising a Co disc (diameter: 82 mm, thickness: 3 mm) having sintered $B_2O_3$ pellets (diameter: 10 mm, thickness: 5 mm) thereon Substrate: Quartz glass (size: 40 mm×40 mm, thickness: 0.7 mm); or Pyrex Glass (registered trademark, size: 50 mm×50 mm, thickness: 0.5 mm)

Anode voltage: 1.0 kV

Anodic current: 75 to 80 mA

Injection power: 50 to 55W

Reflection power: 5 to 10W

Degree of ultimate vacuum: $1.5\times10^{-7}$ to $3.0\times10^{-7}$ torr

Pressure of argon: $9.0\times10^{-2}$ torr

Applied magnetic field: 50 Oe

Means of controlling substrate temperatures: by watercooling

Distance between electrodes: 40 mm

Pre-sputtering time: 2 to 3 hours

Sputtering time: 5 to 6 hours

Method for changing film composition: by changing the number of the $B_2O_3$ pellets.

EXAMPLE 6

Process for preparation: rf sputtering process between two electrodes

Target: Composite target comprising a $Co_{76}B_{24}$ alloy disc (diameter: 65 mm, thickness: 6 mm) having sintered $B_2O_3$ pellets (diameter: 10 mm, thickness: 5 mm) thereon.

Substrate: Quartz glass (size: 40 mm×40 mm, thickness: 0.7 mm); or Pyrex Glass (registered trademark size: 50 mm×50 mm, thickness: 0.5 mm)

Anode voltage: 1.0 kV

Anodic current: 75 to 80 mA

Injection power: 60 to 65 W

Reflection power: 15 to 20 W

Degree of ultimate vacuum: $1.5\times10^{-7}$ to $3.0\times10^{-7}$ torr

Pressure of argon: $9.0\times10^{-2}$ torr

Applied magnetic field: 50 Oe

Means of controlling substrate temperatures: by watercooling

Distance between electrodes: 40 mm

Pre-sputtering time: 2 to 3 hours

Sputtering time: 5 to 7 hours

Method for varying film composition: by changing the number of the $B_2O_3$ pellets.

c. $(FeCr)_xB_yO_z$ Amorphous Film

EXAMPLE 7

Process for preparation: rf sputtering process between two electrodes

Target: Composite target comprising a $Fe_{83}B_{17}$ alloy disc (diameter: 65 mm, thickness: 6 mm) having sintered $Cr_2O_3$ pellets (diameter: 10 mm, thickness: 5 mm) thereon Substrate: Quartz glass (size 40 mm×40 mm, thickness: 0.7 mm)

Anode voltage: 1.45 kV

Anodic current: 105 to 115 mA

Injection Power: 120 to 125 W

Reflection Power: 20 to 25 W

Degree of ultimate vacuum: $1.5\times10^{-7}$ to $3.0\times10^{-7}$ torr

Pressure of argon: $9.0\times10^{-2}$ torr

Applied magnetic field: 50 Oe

Means of controlling substrate temperatures: by water-cooling

Distance between electrodes: 40 mm

Pre-sputtering time: 2 to 3 hours

Sputtering time: 3 to 5 hours

Method for changing film composition: by changing the number of the $Cr_2O_3$ pellets.

Whether the structure of the films prepared above were amorphous or crystalline was determined by the x-ray diffraction method. As a result, it was found that the films prepared from the composite targets comprising the $B_2O_3$ pellets placed on the $Fe_{83}B_{17}$ disc or $Co_{76}B_{24}$ had all an amorphous structure under the sputtering conditions specified above. On the other hand, when using the composite targets comprising the $B_2O_3$ pellets placed on the Fe or Co disc, ferro-magnetic amorphous phase could be obtained only in a narrower composition region than the composition region of the ferromagnetic amorphous phase defined by the pentagonal area ABCDE shown in FIG. 1. However, the composition region of the ferromagnetic amorphous phase can be expanded to a broader region, for example, by using an alloy target containing amorphous phase-forming elements or by appropriately varying sputtering conditions, such as the pressure of argon.

FIGS. 18(*a*) to 18(*d*) are x-ray diffraction patterns for the ferromagnetic amorphous film prepared in Example 4, wherein FIG. 18(*a*) is for the film before heat treatment (as-prepared) and FIGS. 18(*b*), 18(*c) and 18(d*) are for the film heat-treated at 200° C., 550° C. and 600° C. in air, respectively. As noted in the x-ray diffraction patterns, crystallization was induced by the heat treatment at approximately 600° C. in air and this crystallization temperature is higher than that of usual amorphous metals. By this crystallization, the peaks due to hematite distinctly appeared as shown in the x-ray diffraction pattern of FIG. 18(*d*) with an arrow and the change in hysteresis loop was detected as a dramatic reduction in saturation magnetization, as shown in FIG. 9. The quantitative analysis of composition was made on the constituent elements of each film, including light elements of B and O by EPMA.

In the structural analysis of the above films by EPMA and ESCA, an anomalous change was detected particularly with respect to a light element (boron). As noted in FIG. 3, boron element is present in two different chemical bonding states and two peaks corresponding to the two bonding states shift depending on the contents of boron and oxygen. From the above analytical data and consideration, it may be concluded that the Fe-B-O amorphous films of the present invention have a quite novel structure composed of a metallic amorphous phase and an oxide compound amorphous phase and are quite different from a simple amorphous structure, such as a two-phase structure of $B_2O_3$ and Fe-B with a particular composition.

FIG. 10 is a graph of absorbancy for the film of Example 4 before (in the as-prepared state) and after heat treatments. It can be readily seen from FIG. 10 that the absorbancy is quite suddenly reduced in the vicinity of 680 nm and 1250 nm by the oxidizing treatment at a low temperature of 200° C. and particularly, in the wavelength region of 1250±75 nm, the film almost completely transmits light.

Measurements of electrical resistivity by a four probe method were carried out on the resulting Fe films and it has been found that oxygen plays an important role in obtaining a high resistivity of the order of $10^6 \mu\Omega$.cm. Further, the ferromagnetic amorphous $Fe_xB_yO_z$ alloys were found to have ferromagnetic properties and a high saturation magnetization. According to the present invention, there can be obtained the amorphous Fe-B-O films with high electrical resistivity and high saturation magnetization properties by varying the composition. Similar advantageous effects can be obtained in the case of Co-B-O system. In the case of Fe-Cr-B-O system, in addition to the aforesaid effects, the high squareness ratio, i.e., about 90%, and isotropic properties were confirmed in its hysteresis loop.

Further, Fe-Cr-B-O system alloys are new materials having other attractive properties, such as very high hardness and considerably improved corrosion resistance as well as the foregoing magnetic properties. The surface of ferromagnetic amorphous $M_xG_yO_z$ films is covered with a chemically stable coating and the coating keeps the films free from any detrimental changes in electrical and magnetic properties.

In the previous Examples, only B O was employed as glass-forming oxide, but other oxides, such as $SiO_2$, $GeO_2$, $As_2O_3$, $Sb_2O_3$, $TiO_2$, $SnO_2$, $Al_2O_3$ or $ZrO_2$ can be also employed with nearly the same results as $B_2O_3$.

As previously described, the present invention provides ferromagnetic amorphous alloys having the novel structure and containing oxygen over a wide range. The amorphous alloys exhibit superior light transmittancy, advantageous magnetic properties (high saturation magnetization, high squareness ratio and isotropic property of magnetic hysteresis loop, etc.), high electrical resistivity and high hardness and thus are very attractive as new ferromagnetic materials.

I claim:

1. A method of preparing an oxygen-containing ferromagnetic amorphous alloy said method comprising the step of:

sputtering an oxygen-containing composite target compose of an oxide and a metal or a metal alloy, thereby forming a film of said amorphous alloy on a substrate, said amorphous alloy consisting of:

$$M_xG_yO_z$$

wherein M is one or more transition elements of Fe, Co and Ni or a combination of said transition element or elements and one or more elements selected from the group consisting of V, Cr, Mn, Nb, Mo, Hf, Ta, W, Pt, Sm, Gd, Tb, Dy and Ho; G is one or more elements selected from the group consisting of B, Ge, As, Sb, Ti, Sn and Zr; oxygen (O) is supplied by said oxide; and x, y and z are the fractional atomic percentages of M, G and O and $x+y+z=100$, the composition of said amorphous alloy being in the pentagonal hatched zone in the attached FIG. 1 and said pentagonal zone being defined by the lines joining the points of A (80, 19, 1), B (50, 49, 1), C (36, 36, 28), D (36, 4, 60) and E (38.5, 1.5, 60) shown in said FIG. 1.

2. A method as claimed in claim 1 in which said sputtering is carried out in the absence of externally supplied oxygen.

3. A method as claimed in claim 2 in which said film is further oxidized by heat-treating in air at a temperature below the crystallization temperature of said amorphous alloy.

4. A method as claimed in claim 2 in which said film of said amorphous alloy is formed by rf sputtering, magnetron sputtering or ion beam sputtering.

5. A method as claimed in claim 2 in which said composite target is composed of (i) a glass-forming oxide compound and a metal or (ii) said compound and an alloy.

6. A method as claimed in claim 2 in which said composite target is composed of a glass-forming oxide compound and an amorphous phase-forming alloy.

7. A method as claimed in claim 2 in which said composite target is composed of an oxide compound and an amorphous phase-forming alloy.

8. A method as claimed in claim 2 in which said composite target is composed of (i) a powdered oxide mixture containing a glass-forming oxide compound and a metal or (ii) said powdered oxide mixture and an alloy.

9. A method as claimed in claim 5 in which said glass-forming oxide compound is selected from the group consisting of $B_2O$, $GeO_2$, $As_2O_3$, $Sb_2O_3$, $TiO_2$, $SnO_2$, and $ZrO_2$ 10. A method as claimed in claim 6 in which said glass-forming oxide compound is selected from the group consisting of $B_2O_3$, $SiO_2$, $GeO_2$, $As_2O_3$, $Sb_2O_3$, $TiO_2$, $SnO_2$, and $ZrO_2$.

11. A method as claimed in claim 8 in which said glass-forming oxide compound is selected from the group consisting of $B_2O_3$, $SiO_2$, $GeO_2$, $As_2O_3$, $Sb_2O_3$, $TiO_2$, $SnO_2$, $Al_2O_3$ and Zr02.

12. A method as claimed in claim 5 in which said metal or alloy of said composite target is selected from the transition elements of Fe, Co and Ni, or alloys of said transition element or elements and one or more elements selected from the group consisting of V, Cr, Mn, Nb, Mo, Hf, Ta, W, Pt, Sm, Gd, Tb, Dy and Ho.

13. A method as claimed in claim 8 in which said metal or alloy of said composite target is selected from the transition elements of Fe, Co and Ni, or alloys of said transition element or elements and one or more elements selected from the group consisting of V, Cr, Mn, Nb, Mo, Hf, Ta, W, Pt, Sm, Gd, Tb, Dy and Ho.

14. A method as claimed in claim 6 in which said amorphous phase-forming alloy is selected from the alloys of one or more elements selected from the group consisting of V, Cr, Mn, Fe, Co, Ni, Nb, Mo, Hf, Ta, W, Pt, Sm, Gd, Tb, Dy and Ho and one or more elements selected from the group consisting of B, Ge, As, Sb, Ti, Sn and Zr.

15. A method as claimed in claim 7 in which said amorphous phase-forming alloy is selected from the alloys of one or more elements selected from the group consisting of V, Cr, Mn, Fe, Co, Ni, Nb, Mo, Hf, Ta, W, Pt, Sm, Gd, Tb, Dy and Ho and one or more elements selected from the group consisting of B, Si, Ge, As, Sb, Ti, Sn and Zr.

16. A method as claimed in claim 7 in which said oxide compound is selected from the group consisting of oxide compounds of V, Cr, Mn, Fe, Co, Ni, Nb, Mo, Hf, Ta, W, Pt, Sm, Gd, Tb, Dy and Ho.

17. A method as claimed in claim 8 in which said powdered oxide mixture contains an oxide compound selected from the group consisting of oxide compounds of V, Cr, Mn, Fe, Co, Ni, Nb, Mo, Hf, Ta, W, Pt, Sm Gd, Tb, Dy and Ho.

18. A method of preparing an oxygen-containing ferromagnetic amorphous alloy, said method comprising the step of:

sputtering an oxygen-containing composite target composed of an oxide and a metal or a metal alloy, in the absence of externally supplied oxygen gas, thereby forming a film of said amorphous alloy on a substrate, said amorphous alloy consisting of:

$$M_xG_yO_z$$

wherein M is one or more transition elements of Fe, Co and Ni or a combination of said transition element or elements and one or more elements selected from the group consisting of V, Cr, Mn, Nb, Mo, Hf, Ta, W, Pt, Sm, Gd, Tb, Dy and Ho; G is one or more elements selected from the group consisting of B, Si, Ge, As, Sb, Ti, Sn, Al and Zr; oxygen (O) is supplied by said oxide; and x, y and z are the fractional atomic percentages of M, G and O and $x+y+z=100$, the composition of said amorphous alloy being in the pentagonal hatched zone in the attached FIG. 1 and said pentagonal zone being defined by the lines joining the points of A (80, 19, 1), B (50, 49, 1), (36, 36, 28), D (36, 4, 60) and E (38.5, 1.5, 60) shown in said FIG. 1.

19. A method as claimed in claim 18 in which said film is further oxidized by heat-treating in air at a temperature below the crystallization temperature of said amorphous alloy.

20. A method as claimed in claim 18 in which said film of said amorphous alloy is formed by rf sputtering, magnetron sputtering or ion beam sputtering.

21. A method as claimed in claim 18 in which said composite target is composed of (i) a glass-forming oxide compound and a metal or (ii) said compound and an alloy.

22. A method as claimed in claim 18 in which said composite target is composed of a glass-forming oxide compound and an amorphous phase-forming alloy.

23. A method as claimed in claim 18 in which said composite target is composed of an oxide compound and an amorphous phaseforming alloy.

24. A method as claimed in claim 18 in which said composite target is composed of (i) a powdered oxide mixture containing a glass-forming oxide compound and a metal or (ii) said powdered oxide mixture and an alloy.

25. A method as claimed in claim 21 in which said glass-forming oxide compound is selected from the group consisting of $B_2O_3$, $SiO_2$, $GeO_2$, $As_2O_3$, $Sb_2O_3$, $TiO_2$, $SnO_2$, $Al_2O_3$, and $ZrO_2$.

26. A method as claimed in claim 22 in which said glass-forming oxide compound is selected from the group consisting of $B_2O_3$, $SiO_2$, $GeO_2$, $As_2O_3$, $Sb_2O_3$, $TiO_2$, $SnO_2$, $Al_2O_3$ and $ZrO_2$.

27. A method as claimed in claim 24 in which said glass-forming oxide compound is selected from the group consisting of $B_2O_3$, $SiO_2$, $GeO_2$, $As_2O_3$, $Sb_2O_3$, $TiO_2$, $SnO_2$, $Al_2O_3$ and $ZrO_2$.

28. A method as claimed in claim 21 in which said metal or alloy of said composite target is selected from the transition elements of Fe, Co and Ni, or alloys of said transition element or elements and one or more elements selected from the group consisting of V, Cr, Mn, Nb, Mo, Hf, Ta, W, Pt, Sm, Gd, Tb, Dy and Ho.

29. A method as claimed in claim 24 in which said metal or alloy of said composite target is selected from the transition elements of Fe, Co and Ni, or alloys of said transition element or elements and one or more elements selected from the group consisting of v, Cr, Mn, Nb, Mo, Hf, Ta, W, Pt, Sm, Gd, Tb, Dy and Ho.

30. A method as claimed in claim 22 in which said amorphous phase-forming alloy is selected from the alloys of one or more elements selected from the group consisting of V, Cr, Mn, Fe, Co, Ni, Nb, Mo, Hf, Ta, W, Pt, Sm, Gd, Tb, Dy and Ho and one or more elements selected from the group consisting of B, Si, Ge, As, Sb, Ti, Sn, Al and Zr.

31. A method as claimed in claim 23 in which said amorphous phase-forming alloy is selected from the alloys of one or more elements selected from the group consisting of V, Cr, Mn, Fe, Co, Ni, Nb, Mo, Hf, Ta, W, Pt, Sm, Gd, Tb, Dy and Ho and one or more elements selected from the group consisting of B, Si, Ge, As, Sb, Ti, Sn, Al and Zr.

32. A method as claimed in claim 23 in which said oxide compound is selected from the group consisting of oxide compounds of V, Cr, Mn, Fe, Co, Ni, Nb, Mo, Hf, Ta, W, Pt, Sm, Gd, Tb, Dy and Ho.

33. A method as claimed in claim 24 in which said powdered oxide mixture contains an oxide compound selected from the group consisting of V, Cr, Mn, Fe, Co, Ni, Nb, Mo, Hf, Ta, W, Pt, Sm, Gd, Tb, Dy, and Ho.

* * * * *

UNITED STATES PATENT AND TRADEMARK OFFICE

CERTIFICATE OF CORRECTION

PATENT NO. : 4 865 658

DATED : September 12, 1989

INVENTOR(S) : Toshio KUDO

It is certified that error appears in the above-identified patent and that said Letters Patent is hereby corrected as shown below:

On the title page, righthand column, last item, change "32 Claims" to ---33 Claims---.

Column 12, line 31; change "compose" to ---composed---.

Column 13, line 10; change "$B_2O$," to ---$B_2O_3$,---.

line 14; delete "$SiO_2$".

line 18; delete "$SiO_2$".

line 19; delete "$Al_2O_3$"

change "Zr02" to ---$ZrO_2$---.

line 43; delete "Si,".

Column 14, line 10; after "B (50, 49, 1)," insert ---C---.

line 57; change "v" to ---V---.

Signed and Sealed this

Eleventh Day of December, 1990

Attest:

HARRY F. MANBECK, JR.

Attesting Officer

Commissioner of Patents and Trademarks